United States Patent Office 3,410,802
Patented Nov. 12, 1968

3,410,802

PROCESS AND COMPOSITION FOR ETCHING OF COPPER METAL

Kenneth J. Radimer, Little Falls, and Frank E. Caropreso, Hamilton Square, N.J., assignors to FMC Corporation, New York, N.Y., a corporation of Delaware No Drawing. Filed Feb. 21, 1966, Ser. No. 528,818
18 Claims. (Cl. 252—79.1)

ABSTRACT OF THE DISCLOSURE

Undercutting of copper during etching with a peroxydisulfate is reduced by providing in the etching solution, a microcrystalline, modified chrysotile in which the ratio of $SiO_2$ to MgO is between 1.05:1.0 and 1.3:1.0 by weight, and in which at least 10% by weight of the modified chrysotile is of submicron particle size in all dimensions.

This invention relates to the etching of copper bearing a resist pattern, and more particularly to the etching of copper with a peroxydisulfate solution which avoids undue sideways etching or undercutting of the copper relief provided by etching.

Methods have been developed for selectively dissolving or etching copper in the production of electrical printed circuits, printing plates or other products having predetermined raised portions, or reliefs, of copper metal. In the production of printed circuits, for example, copper foil is laminated to a plastic sheet, or to a fiber sheet impregnated with a bonding material such as a phenolic resin, and is masked with a resist material in pattern areas which later become the circuit. The copper foil is subjected to attack by an etchant in unmasked areas, preferably by an aqueous peroxydisulfate etching solution. The resist material may be an ink, a wax, a photographically developed image, solder or the like, and since the resist is not attacked by the etchant, the copper is dissolved preferentially in areas not coated by the resist.

Peroxydisulfates are particularly preferred as etchants because they provide clean, essentially odor-free etching solutions which can be used quite safely and whose reaction products can be treated readily for disposal. When competitive materials, notably ferric chloride, are employed the etching solution is a toxic, noxious system which presents difficulties both in use and in disposal of spent etchant.

However, a problem has existed when peroxydisulfates are employed as etchants, which heretofore has not been susceptible to easy solution. It is desired to provide an essentially straight up-and-down etch. That is, it is harmful to printed circuits, printing plates and other products produced by etching, to have the copper metal etched away sideways beneath the resist such that the top of the relief provided by etching has a smaller surface area than a cross-section of the relief at a point beneath the top surface.

While it has been possible with the ferric chloride etching system to incorporate any of several additives in the etching solution which are effective to reduce this sideways etch, known as undercutting, use of these same additives in the peroxydisulfate etching solution not only has not reduced the undercutting problem, but in some cases has interfered with the etch itself. The degree of undercutting is easily measured and can be represented by the so-called "etch factor," which is the ratio of the up-and-down etch to the lateral etch. It is desired to provide etched products having etch factors as high as possible, desirably even in some cases 2.5 or higher, whereas typical peroxydisulfate-etched copper objects often have factors of 1.5 to 2.

It therefore is an object of our invention to provide an improved method of etching copper bearing a resist pattern, which minimizes the usual attack of the peroxydisulfate on the sides of a relief built up upon etching, whereby an etched product having an unusually high etch factor, that is minimal undercutting, is provided.

We have now found that by providing an etching solution comprising about 5% to the solubility limit of a peroxydisulfate of ammonium, sodium, lithium, barium, strontium or potassium and incorporating in said solution about 0.02 to 0.7%, and preferably 0.05 to 0.5%, by weight of a microcrystalline, modified chrysotile in which the ratio of $SiO_2$ to MgO is between 1.05 to 1.0 and 1.3 to 1.0 by weight and at least 10% by weight of the modified chrysotile is of sub-micron particle size in all dimensions, and etching copper bearing a resist pattern with said solution at a temperature of about 50° to 150° F., an etched copper product is provided which has a very satisfactory etch factor. All percentages given herein are by weight.

Thus, a typical etched copper printed circuit prepared from a copper foil 0.0014 inch thick employing a tin-lead solder resist pattern etched with a 20% ammonium peroxydisulfate solution had an etch factor of 1.8, whereas when 0.1% of our microcrystalline, modified chrysotile was added to this etching solution, a corresponding etch yielded a printed circuit product having an etch factor of 2.9.

The microcrystalline, modified chrysotile employed in our etching baths is defined fully in the copending U.S. patent application Ser. No. 436,304, filed Mar. 1, 1965 and assigned to the assignee hereof. This material is prepared from chrysotile asbestos, a fibrous hydrated magnesium silicate composed of bundles of strong, long fibers associated in fiber bundles. The naturally occuring chrysotile has a ratio of $SiO_2$ to MgO of 1.0 to 1.0 by weight. A useful method of treating this mineral to provide the microcrystalline material used in our etching baths, is described in the aforesaid copending patent application Ser. No. 436,304. The mineral is treated with an acid or acid salt, for example with 0.2 N hydrofluoric acid at 5 to 10% chrysotile solids for ½ to 4 hours at the reflux temperature. This provides a change in the $SiO_2$ to MgO ratio to about 1.21 to 1.0. After this treatment the hydrated material is drained and water-washed and then mechanically disintegrated, preferably by a shearing action, for example in a Waring Blendor. The product has at least 10% of microcrystalline colloidal segments of asbestos fibers which are submicron in size. Other chemical reagents, and other mechanical disintegration means, may be used in preparing the microcrystalline, modified chrysotile.

A typical form of copper which is etched in accordance with our invention is copper foil about 0.0014 to about 0.0070 inch in thickness, carried on a backing material such as a resin-bonded fiber sheet or other backing material. Other forms of copper may be etched by our process, as for example sheets or blocks of the metal in preparation of printing plates, decorative items and the like.

The aqueous etching solution employed to each copper bearing a suitable etching resist contains about 5% to its solubility limit, and preferably about 5 to 25%, of an ammonium, sodium, potassium, barium, lithium or strontium peroxydisulfate, and the herein amount of about 0.02% to 0.7%, and preferably 0.05% to 0.5% by weight of our microcrystalline, modified chrysotile. Use of less than 0.02% of our addtiive does not normally provide adequate improvement in etch factor, whereas use of substantially more than about 0.7% of the microcrystalline, modified chrysotile in the etching system may tend to reduce the etching rate.

The preferred peroxydisulfate for use in this process is ammonium peroxydisulfate. In order to speed the rate of etching with the ammonium or other peroxydisulfate, about 5 parts per million of mercuric chloride or other mercuric salt may be added to the solution as a dissolution catalyst. These solutions are well known in the art. For example, the use of ammonium or other peroxydisulfate solutions catalyzed with mercuric chloride or other catalysts for copper dissolution is described fully in U.S. Patent 2,978,301.

The etch factor in an etched copper product is determined by measuring the depth of the etch relative to the sideways or lateral etch beneath the resist, and is calculated in accordance with the following formula:

$$EF=d/u$$

wherein $EF$ is etch factor, $d$ is the depth of the etch and $u$ is the distance by which the etching resist is undercut. Measurements are made on one edge of the relief remaining after etching.

Typical resists employed in producing the pattern for etching are provided by imprinting an ink, a wax or the like on the copper surface, by photographically developing an image from a photosensitive material such as polyvinyl cinnamate, by electroplating a tin-lead solder, typically a tin-lead solder containing 60 to 63% of tin, on the surface of the copper or by providing the image through dipping suitably masked copper into a molten solder bath. When solder is to be deposited, a wax or other suitable masking imprint is provided in areas to be left free of the resist. Following etching the resist can be removed by the usual means, or where desired, for example in the case of the solder resist, it may be left on the copper for aesthetic reasons or to provide a good base for soldering in production of electrical circuits and the like.

The following examples are provided only by way of illustration of our invention and are not to be deemed as limiting the scope thereof in any way.

Example 1

Copper foils measuring 0.0014 inch in thickness were bonded to glass fiber-containing phenol formaldehyde backing sheets and a photoresist, polyvinyl cinnamate photosensitized with benzophenone, was provided on the surface of the copper in areas (about 35% of the copper surface) which were to represent a printed electrical circuit. The resulting copper board bearing the resist pattern was etched in areas not bearing the resist in an aqueous solution containing by weight 20% of ammonium peroxydisulfate, 5 parts per million of mercuric chloride and the indicated amounts of the additives shown in Table 1 which follows.

The etch was carried out at 100° F., in a spray etcher having a four gallon capacity. A uniform spray distribution was provided by utilizing eight spray nozzles which oscillated 15° in each direction from horizontal. Following etching the specimens were removed from the etching bath, rinsed with distilled water and observed. The results of the observations and details of the runs are shown in Table I which follows.

Example 2

This example compared use of 0.45% of the microcrystalline, modified chrysotile used in Examples 1*b* to 1*e* above, with an etchant employing none of this additive, in a so-called immersion etch. The copper board to be etched was immersed in the etchant solution which was stirred with an air sparger. The etch factor obtained when no microcrystalline, modified chrysotile additive was employed was 1.5, whereas when our additive was present the etch factor was 2.3.

Example 3

Use of aqueous solutions containing 20% of sodium peroxydisulfate, barium peroxydisulfate, strontium peroxoxydisulfate and lithium peroxydisulfate respectively in the process of Example 1 in place of the ammonium peroxydisulfate solution used therein as an etchant, provides results comparable to those shown in the table in Example 1. That is, etches carried out with none of our microcrystalline, modified chrysotile additive present in the etching bath provided etch factors of on the order of 1.5 to 1.8, whereas when this additive was present in amounts varying from 0.06 to 0.5% by weight of the solution, etch factors well above 2 were provided. Use of potassium peroxydisulfate resulted in similar etch factor differences in the presence and absence of the microcrystalline, modified chrysotile additive; in the case of the potassium peroxydisulfate, however, this peroxydisulfate was soluble to the extent of only 5% and the etch rate was approximately ¼ that resulting from use of the other peroxydisulfates.

Example 4

Use of microcrystalline, modified chrysotiles having $SiO_2$ to MgO weight ratios of 1.05 to 1, and of 1.3 to 1, in the etching solutions of Example 1*b* to 1*e* in place of the additives used therein likewise results in production of etched products having excellent etch factors as compared with etched products made in the absence of our additive.

Example 5

Use of chrysotile asbestos which had been dispersed by beating in water in a Waring Blendor for 60 minutes, at a solids concentration of 4% by weight, in place of the microcrystalline, modified chrysotile used in Examples 1*b* to 1*e* above, resulted in no improvement in the etch factor of the etched product, providing etch factors of about 1.4. The Waring Blendor-dispersed chrysotile of this Example 5 was used in amounts of 0.05% and 0.1% by weight.

It is seen from these examples that our microcrystalline, modified chrysotile additive is extremely effective in providing high etch factors, that is, in reducing undercutting, in the etching of pattern-resisted copper with aqueous peroxydisulfate solutions. It is seen also that additives commonly employed with another well-known etchant, ferric chloride, namely thiourea and formamide disulfide, have essentially no beneficial effect on the undercutting characteristics of peroxydisulfate etching solution.

Pursuant to the requirements of the patent statutes, the principle of this invention has been explained and exemplified in a manner so that it can be readily practiced by those skilled in the art, such exemplification including TABLE I.—ETCH FACTORS OF PRINTED CIRCUITS ETCHED WITH PEROXYDISULFATE SOLUTIONS CONTAINING VARIOUS ADDITIVES

| | Etchant | Additive | Etch Factor |
|---|---|---|---|
| (a) | 20% Ammonium peroxydisulfate 5 p.p.m. mercuric chloride | None | 1.7 |
| (b) | do | 0.06% Microcrystalline modified chrysotile [1] | 2.9–3.0 |
| (c) | do | 0.09% Microcrystalline modified chrysotile [1] | 3.1 |
| (d) | do | 0.36% Microcrystalline modified chrysotile [1] | 3.1 |
| (e) | do | 0.5% Microcrystalline modified chrysotile [1] | 3.3 |
| (f) | (Comparative) 20% Ammonium peroxydisulfate 5 p.p.m. mercuric chloride | 0.1% Thiourea [2] | 1.5 |
| (g) | do | .05% Formamide disulfide [2] | 1.1 |
| (h) | do | .9% Formamide disulfide [2] | 1.8 |

[1] A modified chrysotile having a 1.22 to 1 by weight ratio of $SiO_2$ to MgO was used. 20% of this material was submicron in size.

[2] Additives useful in improving the etch factor when ferric chloride is used as a copper etchant. These are comparative examples.

what is considered to represent the best embodiment of the invention. However, it should be clearly understood that, within the scope of the appended claims, the invention may be practiced by those skilled in the art, and having the benefit of this disclosure, otherwise than as specifically described and exemplified herein.

What is claimed is:

1. A method of etching copper bearing a patterned resist to provide an etched copper product having a high etch factor, comprising contacting said copper bearing said patterned resist with an aqueous etching system containing from 5% by weight to its solubility limit of a peroxydisulfate from the group consisting of ammonium, sodium, lithium, barium, strontium, and potassium peroxydisulfates and 0.02% to 0.7% by weight of a microcrystalline, modified chrysotile in which the ratio of $SiO_2$ to MgO is between 1.05 to 1.0 and 1.3 to 1.0 by weight and in which at least 10% by weight of the modified chrysotile is of sub-micron particle size in all dimensions, at a temperature of 50° to 150° F. until the copper in areas free of resist has been etched, and removing the resulting etched workpiece from said aqueous peroxydisulfate etching system.

2. The method of claim 1 in which the microcrystalline, modified chrysotile is present in the amount of 0.05 to 0.5% by weight.

3. The method of claim 1 in which ammonium peroxydisulfate is employed as the peroxydisulfate.

4. The method of claim 1 in which sodium peroxydisulfate is employed as the peroxydisulfate.

5. The method of claim 1 in which lithium peroxydisulfate is employed as the peroxydisulfate.

6. The method of claim 1 in which barium peroxydisulfate is employed as the peroxydisulfate.

7. The method of claim 1 in which strontium peroxydisulfate is employed as the peroxydisulfate.

8. The method of claim 1 in which potassium peroxydisulfate is employed as the peroxydisulfate.

9. Method of claim 1 in which the aqueous peroxydisulfate etching system contains mercuric ions as a catalyst for copper etching.

10. An aqueous bath for etching copper bearing a patterned resist to provide an etched copper product having a high etch factor, comprising water, from 5% by weight to its solubility limit of a peroxydisulfate from the group consisting of the ammonium, sodium, lithium, barium, strontium, and potassium peroxydisulfates and 0.02% to 0.7% by weight of a microcrystalline, modified chrysotile in which the ratio of $SiO_2$ to MgO is between 1.05 to 1.0 and 1.3 to 1.0 by weight and in which at least 10% by weight of the modified chrysotile is of sub-micron particle size in all dimensions.

11. The composition of claim 10 in which the microcrystalline, modified chrysotile is present in the amount of 0.05 to 0.5% by weight.

12. The composition of claim 10 in which ammonium peroxydisulfate is present as the peroxydisulfate.

13. The composition of claim 10 in which sodium peroxydisulfate is present as the peroxydisulfate.

14. The composition of claim 10 in which lithium peroxydisulfate is present as the peroxydisulfate.

15. The composition of claim 10 in which barium peroxydisulfate is present as the peroxydisulfate.

16. The composition of claim 10 in which strontium peroxydisulfate is present as the peroxydisulfate.

17. The composition of claim 10 in which potassium peroxydisulfate is present as the peroxydisulfate.

18. Composition of claim 10 in which mercuric ions are present as a catalyst for copper etching.

References Cited

UNITED STATES PATENTS 2,978,301 4/1961 Margulies et al. ------ 202—79.1

MAYER WEINBLATT, *Primary Examiner.*